(12) United States Patent
Kim et al.

(10) Patent No.: US 8,716,704 B2
(45) Date of Patent: May 6, 2014

(54) ORGANIC ELECTROLUMINESCENT DEVICE AND METHOD OF FABRICATING THE SAME

(71) Applicant: LG Display Co., Ltd., Seoul (KR)

(72) Inventors: Kyung-Man Kim, Seoul (KR);
Doo-Hyun Ko, Seongnam-si (KR);
Sung-Joon Bae, Seongnam-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/708,253

(22) Filed: Dec. 7, 2012

(65) Prior Publication Data

US 2013/0092920 A1    Apr. 18, 2013

Related U.S. Application Data

(62) Division of application No. 11/154,980, filed on Jun. 17, 2005, now Pat. No. 8,368,674.

(30) Foreign Application Priority Data

Aug. 10, 2004  (KR) ............................ 10-2004-062689

(51) Int. Cl.
*H01L 29/08* (2006.01)
*H01L 35/24* (2006.01)
*H01L 51/00* (2006.01)

(52) U.S. Cl.
USPC .................. 257/40; 257/59; 257/89; 257/296; 257/E21.409; 438/34; 438/149; 438/148

(58) Field of Classification Search
USPC ........ 257/34, 40, 59, 72, 88, 89, 296; 438/23, 438/34, 104, 29, 166, 149, 158, 289
See application file for complete search history.

(56) References Cited

U.S. PATENT DOCUMENTS

| | | | |
|---|---|---|---|
| 5,071,779 A | 12/1991 | Tanaka et al. | |
| 6,608,658 B1 | 8/2003 | Tsujimura et al. | |
| 7,180,108 B2 | 2/2007 | Kawase et al. | |
| 2004/0036072 A1 | 2/2004 | Tsujimura et al. | |
| 2004/0135164 A1* | 7/2004 | Park et al. | 257/99 |
| 2005/0145849 A1 | 7/2005 | Moon et al. | |

FOREIGN PATENT DOCUMENTS

| | | |
|---|---|---|
| CN | 1440223 | 3/2003 |
| CN | 1460295 | 3/2003 |
| JP | 2000-150895 | 5/2000 |
| KR | 979263 | 8/2010 |
| WO | WO 2004/023561 | 3/2004 |

* cited by examiner

*Primary Examiner* — George Fourson, III
*Assistant Examiner* — Wilner Jean Baptiste
(74) *Attorney, Agent, or Firm* — Morgan, Lewis & Bockius LLP

(57) ABSTRACT

An organic electroluminescent device including a driving element having a driving gate electrode connected to the switching element, the driving gate electrode formed uniformly on the substrate, a driving source electrode having a first driving source electrode along a first direction and a plurality of second driving source electrodes extending from the first driving source electrode along a second direction crossing the first direction, a driving drain electrode spaced apart from the driving source electrode, the driving drain electrode having a first driving drain electrode along the first direction and a plurality of second driving drain electrodes extending from the first driving drain electrode along the second direction, wherein the plurality of second driving source electrodes alternate with the plurality of second driving drain electrodes, wherein the driving source electrode and the driving drain electrode including an interval therebetween are facing the driving gate electrode.

4 Claims, 16 Drawing Sheets

ORGANIC ELECTROLUMINESCENT DEVICE AND METHOD OF FABRICATING THE SAME

This application is a Divisional of Copending U.S. patent application Ser. No. 11/154,980 filed Jun. 17, 2005, and claims benefit of Korean Patent Application No. 2004-062689 filed Aug. 10, 2004, which are hereby incorporated by reference in their entirety.

BACKGROUND OF THE INVENTION

1. Field of the Invention

The present invention relates to an organic electroluminescent device and more particularly, to an active matrix organic electroluminescent device and a method of fabricating the same.

2. Discussion of the Related Art

In general, an organic electroluminescent device (OLED) emits light by injecting electrons from a cathode and holes from an anode into an emission layer, combining the electrons with the holes, generating an exciton, and transitioning the exciton from an excited state to a ground state. Compared to a liquid crystal display (LCD) device, an additional light source is not necessary for the OLED to emit light because the transition of the exciton between the two states causes light to be emitted. Accordingly, the size and weight of the OLED can be reduced. The OLED has other excellent characteristics such as low power consumption, superior brightness, and fast response time. Because of these characteristics, the OLED is a promising display for next-generation consumer electronic applications such as cellular phones, car navigation systems (CNS), personal digital assistants (PDA), camcorders, and palmtop computers. Moreover, since fabricating the OLED is a simple process with a few processing steps, an OLED is cheaper to produce than a LCD device.

Two different types of OLEDs exist: passive matrix and active matrix. While both the passive matrix OLED and the active matrix OLED have a simple structure and are formed by a simple fabricating process, the passive matrix OLED requires a relatively high amount of power to operate. In addition, the display size of a passive matrix OLED is limited by its structure. Furthermore, as the number of conductive lines increases, the aperture ratio of a passive matrix OLED decreases. In contrast, active matrix OLEDs are highly efficient and can produce a high-quality image for a large display with relatively low power.

FIG. 1 is a schematic cross-sectional view of an OLED according to a related art. In FIG. 1, an array element 14 including a thin film transistor (TFT) T is formed on a first substrate 12. A first electrode 16, an organic electroluminescent layer 18, and a second electrode 20 are formed over the array element 14. The organic electroluminescent layer 18 may separately display red, green, and blue colors for each pixel region. A second substrate 28 faces the first substrate 12 and is spaced apart from the first substrate 12.

The first and the second substrates 12 and 28 are attached to each other with a sealant 26. The OLED is encapsulated by attaching the first substrate 12 to the second substrate 28. The second substrate 28 includes a moisture absorbent material 22 to eliminate moisture and oxygen that may penetrate into a capsule of the organic electroluminescent layer 18. After etching a portion of the second substrate 28, the etched portion is filled with the moisture absorbent material 22 and the filled moisture absorbent material is fixed by a holding element 25.

FIG. 2 is an equivalent circuit diagram of the OLED according to the related art. In FIG. 2, a gate line 36 crosses a data line 49, and a switching element $T_S$ at a crossing of the gate line 36 and the data line 49 is connected to the gate line 36 and the data line 49. A driving element $T_D$ electrically connects the switching element $T_S$ to an organic electroluminescent diode $D_{EL}$. A storage capacitor $C_{ST}$ is formed between a driving gate electrode 34 and a driving source electrode 52 of the driving element $T_D$, as the driving element $T_D$ is a positive type transistor. The organic electroluminescent diode $D_{EL}$ is connected to a power line 62, and the driving drain electrode may be connected to an anode of the organic electroluminescent diode $D_{EL}$.

When a scan signal of the gate line 36 is applied to a switching gate electrode 32 of the switching element $T_S$, an image signal of the data line 49 is applied to the driving gate electrode 34 of the driving element $T_D$ through the switching element $T_S$. The current density of the driving element $T_D$ is modulated by the image signal applied to the driving gate electrode 34. As a result, the organic electroluminescent diode $D_{EL}$ can display images with gray scale levels. Moreover, because the image signal stored in the storage capacitor $C_{ST}$ is applied to the driving gate electrode 34, the current density flowing into the organic electroluminescent diode $D_{EL}$ is uniformly maintained until the next image signal is applied, even when the switching element $T_S$ is turned off. The switching element $T_S$ and the driving element $T_D$ can be a polycrystalline silicon TFT or an amorphous silicon TFT. The process of fabricating an amorphous silicon TFT is simpler than the process for a polycrystalline silicon TFT.

FIG. 3 is a schematic cross-sectional view illustrating a switching element and a driving element including an amorphous TFT for one pixel region of an OLED according to the related art. In FIG. 3, a gate line 36 is formed on a substrate 30 in a first direction, a data line 49 crosses the gate line 36 in a second direction to define a pixel region P, and a power line 62 is arranged in parallel to the data line 49 and crosses the gate line 36. A switching element $T_S$ adjacent to the pixel region P is connected to the gate and data lines 36 and 49. A driving element $T_D$ is connected to the switching element $T_S$. In addition, the switching element $T_S$ includes switching gate electrode 32, switching semiconductor layer 56, switching source electrode and drain electrode 48 and 50. The driving element $T_D$ includes a driving gate electrode 34, a driving semiconductor layer 58, a driving source electrode and a driving drain electrode 52 and 54. Specifically, the driving gate electrode 34 is connected to the switching drain electrode 50, the driving source electrode 52 is connected to the power line 62, and the driving drain electrode 54 is connected to a first electrode 66 of the organic electroluminescent diode $D_{EL}$ (of FIG. 2). The switching semiconductor layer 56 and the driving semiconductor layer 58 may be formed of amorphous silicon.

The amorphous silicon driving TFT should have a large width to length ratio (W/L ratio) in order to drive the organic electroluminescent diode $D_{EL}$ (of FIG. 2). In this case, a size of the driving element $T_D$ is much larger than a size of the switching element $T_S$ in order to supply enough current to the organic electroluminescent diode $D_{EL}$.

Accordingly, to obtain a large width to length ratio (W/L ratio), the driving source electrode and drain electrode 52 and 54 include first driving source electrode and drain electrode 52a and 54a along the first direction, and second driving source electrode and drain electrode 52b and 54b extending from the first driving source electrode and drain electrode 52a and 54a along the second direction such as a finger shape, respectively. Here, the second driving source electrode 52*b* alternates with the second driving drain electrode 54*b*.

FIG. 4 is a schematic plan view showing a driving element of an OLED according to a first example of the related art.

In FIG. 4, a driving element $T_D$ includes a driving gate electrode 34, a driving semiconductor layer 58 over the driving gate electrode 34, a driving source electrode 52 on the driving semiconductor layer 58 and a driving drain electrode 54 spaced apart from the driving source electrode 52 on the driving semiconductor layer 58. Although not shown, the driving semiconductor layer 58 includes a driving active layer of an intrinsic amorphous silicon and a driving ohmic contact layer of a doped amorphous silicon on the active layer. An exposed portion of the driving active layer between the driving source electrode and the drain electrode 52 and 54 acts as a channel in which electrons or holes pass through. As the width to length ratio (W/L ratio) increases the on current characteristic correspondingly improve. Therefore, to obtain this advantage, the driving source electrode and drain electrode 52 and 54 are formed as a plurality of finger shapes. At this time, the driving gate electrode 34 under the driving source electrode and drain electrode 52 and 54 is formed with an opening portion OP to minimize an overlap portion between the driving gate electrode 34 and the driving source electrode and drain electrode 52 and 54. More specifically, this structure is utilized for reducing parasitic capacitance due to the overlapping portion.

Hereinafter, it will be explained about the structure in accordance with the driving gate electrode 34 and the driving source electrode and drain electrode 52 and 54 referring to a specific numerical value.

When a channel length L defined as a distance between the driving source electrode 52 and the driving drain electrode 54 is about 6 micrometers and an overlapping width between the driving gate electrode 34 and the driving source electrode and drain electrode 52 and 54 is about 3 micrometers, a minimum width of the driving gate electrode 34 should be about 12 micrometers. Accordingly, the distance between the plurality of driving gate electrode 34 patterns adjacent to each other is about 6 micrometers and the distance between the driving source electrode 52 and the driving drain electrode 54 is about 6 micrometers. In addition, the widths of the driving source electrode 52 and the driving drain electrode 54 should be at least about 12 micrometers, respectively. Here, outermost portions of the driving source electrode 52 overlapping outermost portions of the driving gate electrode 34 correspond to about 6 micrometers.

Consequently, a width of the driving element $T_D$ of FIG. 4 can be calculated as follows:

The width of the driving source electrode 52: (6 micrometers×2)+12=24 micrometers The width of the driving drain electrode 54: 12 micrometers×2=24 micrometers The total channel length L of the driving element $T_D$: 6 micrometers×4=24 micrometers Accordingly, the width of the driving element $T_D$: 24 micrometers×3=72 micrometers Consequently, when the driving source electrode and drain electrode 52 and 54 are formed as having a finger shape and the driving gate electrode 34 is formed with the opening portion OP, the width of the driving element $T_D$ may be about 72 micrometers. A driving element $T_D$ having a ring shape is suggested to enlarge the width to length ratio (W/L ratio) as another example of the related art.

FIG. 5 is a schematic plan view showing a driving element of an OLED according to a second example of the related art.

In FIG. 5, a driving element $T_D$ includes a driving gate electrode 80, a driving semiconductor layer 82 over the driving gate electrode 80, a driving source electrode 83 and a driving drain electrode 86 spaced apart from the driving source electrode 83 on the driving semiconductor layer 82. Here, the driving gate electrode 80 has a first ring shape, and the driving source electrode 83 has a second ring shape overlapping outermost portion of the first ring shape of the driving gate electrode 80. The driving source electrode 83 surrounds the driving drain electrode 86 having an elliptical shape covering an opening portion OP of the driving gate electrode 80.

Also, this structure should be formed to obtain a large width to length ratio (W/L ratio), so the ring-type driving element is manufactured as an excessive size in comparison to the switching element $T_S$ (of FIG. 3). Therefore, since a size of the driving element $T_D$ occupies a significant area in the pixel region P (of FIG. 3), the display region is reduced. Consequently, it is difficult to manufacture an OLED having high aperture ratio and high resolution.

SUMMARY OF THE INVENTION

Accordingly, the present invention is directed to an OLED and a method of fabricating the same that substantially obviate one or more of the problems due to limitations and disadvantages of the related art.

An object of the present invention is to provide an OLED having high aperture ratio and high resolution.

Another object of the present invention is to provide a method of fabricating an OLED having high aperture ratio and high resolution by reducing the width of the driving element.

Another object of the present invention is to provide an OLED that can obtain enough storage capacitance without additional storage capacitance.

Another object of the present invention is to provide a method of fabricating an OLED that can obtain enough storage capacitance using an overlap portion between the driving gate electrode and the driving source and drain electrodes without additional storage capacitance through forming a driving gate electrode corresponding to the driving source electrode and the driving drain electrode including an interval between the driving source and drain electrodes.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent device includes a gate line on a substrate; a data line crossing the gate line to define a pixel region; a power line crossing one of the gate line and the data line; a switching element including: a switching gate electrode connected to the gate line; a switching source electrode connected to the data line; and a switching drain electrode spaced apart from the switching source electrode; and a driving element including: a driving source electrode connected to the power line, the driving source electrode having a first driving source electrode along a first direction and a plurality of second driving source electrodes extending from the first driving source electrode along a second direction crossing the first direction; a driving drain electrode spaced apart from the driving source electrode, the driving drain electrode having a first driving drain electrode along the first direction and a plurality of second driving drain electrodes extending from the first driving drain electrode along the second direction, wherein the plurality of second driving source electrodes alternate with the plurality of second driving drain electrodes; and a driving gate electrode connected to the switching drain electrode, wherein the driving source electrode and the driving drain electrode including an interval therebetween corresponds to the driving gate electrode; and an organic electroluminescent diode connected to the driving element.

In another aspect, an organic electroluminescent device includes: a gate line on a substrate; a data line crossing the gate line to define a pixel region; a power line crossing one of the gate line and the data line; a switching element including: a switching gate electrode connected to the gate line; a switching source electrode connected to the data line; and a switching drain electrode spaced apart from the switching source electrode; and a driving element including: a driving source electrode connected to the power line, the driving source electrode having a ring shape; a driving drain electrode spaced apart from the driving source electrode and surrounded by the driving source electrode; and a driving gate electrode connected to the switching drain electrode, wherein the driving source electrode and the driving drain electrode including an interval therebetween corresponds to the driving gate electrode; and an organic electroluminescent diode connected to the driving element.

In another aspect, a method of fabricating an organic electroluminescent device includes: preparing a substrate including a pixel region having a switching region and a driving region; forming a gate line, a switching gate electrode in the switching region and a driving gate electrode in the driving region on the substrate, the driving gate electrode covering the driving region; forming a switching semiconductor layer over the switching gate electrode and a driving semiconductor layer over the driving semiconductor layer, respectively; forming a data line crossing the gate line, a switching source electrode connected to the data line, a switching drain electrode spaced apart from the switching source electrode, a driving source electrode having a first driving source electrode along a first direction and a plurality of second driving source electrodes extending from the first driving source electrode along a second direction crossing the first direction, and a driving drain electrode spaced apart from the driving source electrode, the driving drain electrode having a first driving drain electrode along the first direction and a plurality of second driving drain electrodes extending from the first driving drain electrode along the second direction, and a driving gate electrode connected to the switching drain electrode, wherein the plurality of second driving source electrodes alternate with the plurality of second driving drain electrodes, and the driving source electrode and the driving drain electrode including an interval therebetween corresponds to the driving gate electrode; forming a power line crossing one of the gate line and the data line, the power line connected to the driving source electrode; and forming an organic electroluminescent diode connected to the driving element.

In another aspect, a method of fabricating an organic electroluminescent device includes: preparing a substrate including a pixel region having a switching region and a driving region; forming a gate line, a switching gate electrode in the switching region and a driving gate electrode in the driving region on the substrate, the driving gate electrode covering the driving region; forming a switching semiconductor layer over the switching gate electrode and a driving semiconductor layer over the driving semiconductor layer, respectively; forming a data line crossing the gate line, a switching source electrode connected to the data line, a switching drain electrode spaced apart from the switching source electrode, the driving source electrode having a ring shape, a driving drain electrode spaced apart from the driving source electrode and surrounded by the driving source electrode, and a driving gate electrode connected to the switching drain electrode, wherein the driving source electrode and the driving drain electrode including an interval therebetween corresponds to the driving gate electrode; forming a power line crossing one of the gate line and the data line, the power line connected to the driving source electrode; and forming an organic electroluminescent diode connected to the driving drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention. In the drawings.

DETAILED DESCRIPTION OF THE ILLUSTRATED EMBODIMENTS

Reference will now be made in detail to the illustrated embodiments of the present invention, examples of which are illustrated in the accompanying drawings. Wherever possible, the same reference numbers will be used throughout the drawings to refer to the same or like parts.

Figure 6:
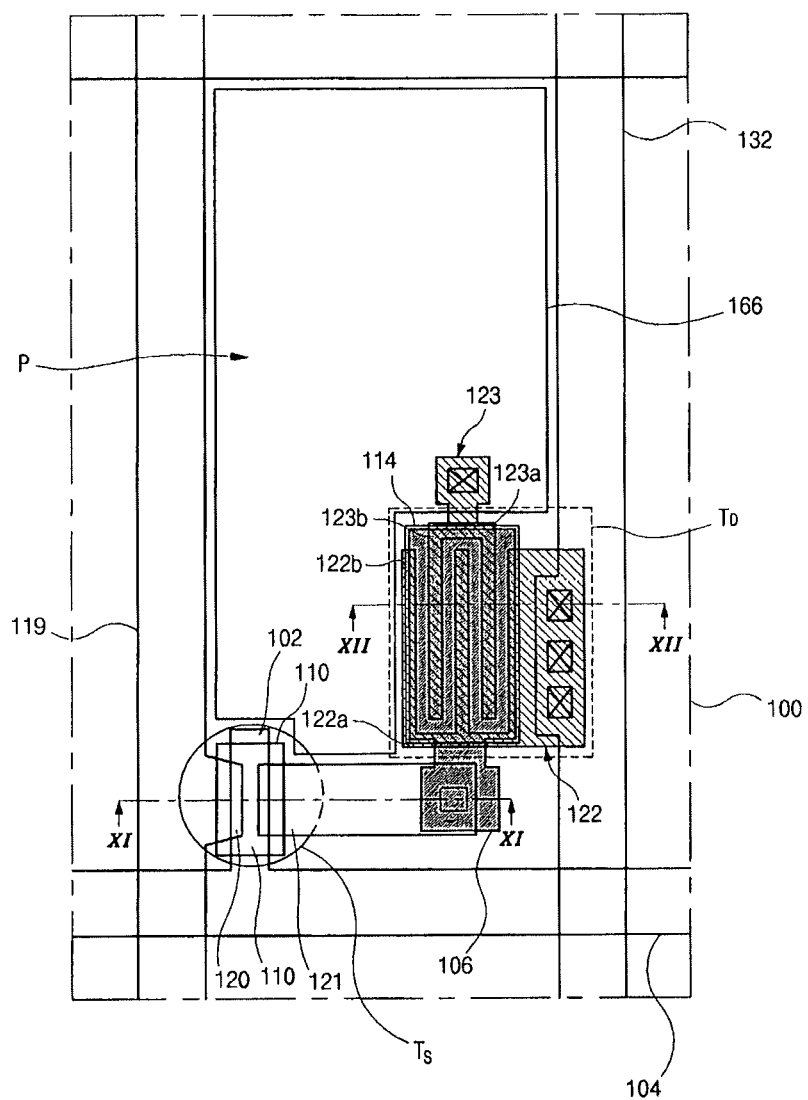
FIG. 6 is an exemplary schematic expanded plan view showing an OLED having a driving element according to the present invention.

FIG. 6 is an exemplary schematic expanded plan view showing an OLED having a driving element according to the present invention.

In FIG. 6, a gate line 104 is formed on a substrate 100 in a first direction, a data line 119 crosses the gate line 104 in a second direction to define a pixel region P, and a power line 132 is arranged in parallel to the data line 119 and crosses the gate line 104. A switching element $T_S$ adjacent to the pixel region P is connected to the gate and data lines 104 and 119. A driving element $T_D$ is connected to the switching element $T_S$. In addition, the switching element $T_S$ includes a switching gate electrode 102, a switching semiconductor layer 110, switching source electrode and drain electrode 120 and 121. The driving element $T_D$ includes a driving gate electrode 106, a driving semiconductor layer 114, a driving source electrode and a driving drain electrode 122 and 123. Specifically, the driving gate electrode 106 is connected to the switching drain electrode 121, the driving source electrode 122 is connected to the power line 132, and the driving drain electrode 123 is connected to a first electrode 166 of an organic electroluminescent diode $D_{EL}$. The switching semiconductor layer 110 and the driving semiconductor layer 114 may be formed of amorphous silicon.

More specifically, the driving source electrode 122 includes a first driving source electrode 122a along a first direction and a plurality of second driving source electrodes 122b extending from the first driving source electrode 122a along a second direction crossing the first direction. The driving drain electrode 123 includes a first driving drain electrode 123a along the first direction and a plurality of second driving drain electrodes 123b extending from the first driving drain electrode 123a along the second direction, wherein the plurality of second driving source electrodes 122b alternate with the plurality of second driving drain electrodes 123b.

It is noted that the driving gate electrode 106 is connected to the switching drain electrode 121, wherein the driving source electrode 122 and the driving drain electrode 123 including an interval therebetween corresponds to the driving gate electrode 106.

Figure 1:
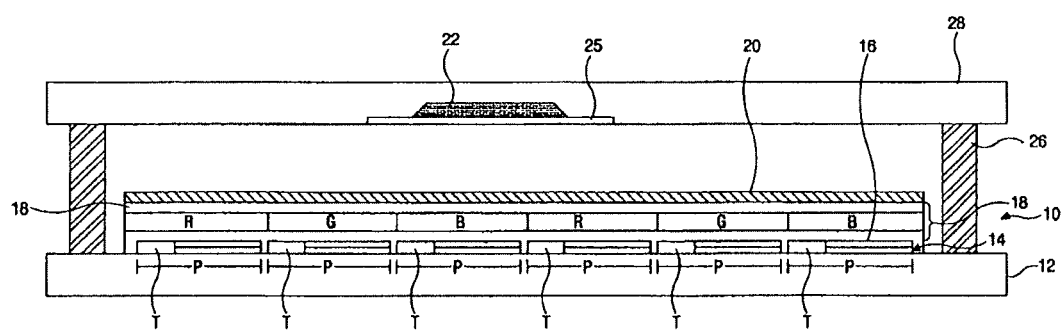
FIG. 1 is a schematic cross-sectional view of an OLED according to a related art.
Figure 2:
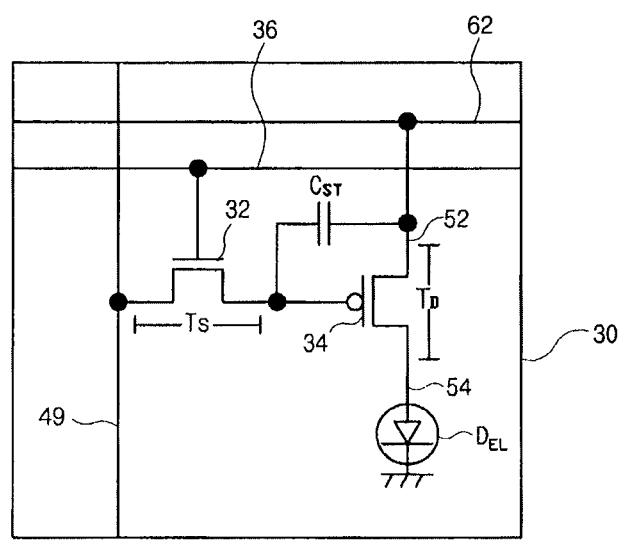
FIG. 2 is an equivalent circuit diagram of the OLED according to the related art.
Figure 3:
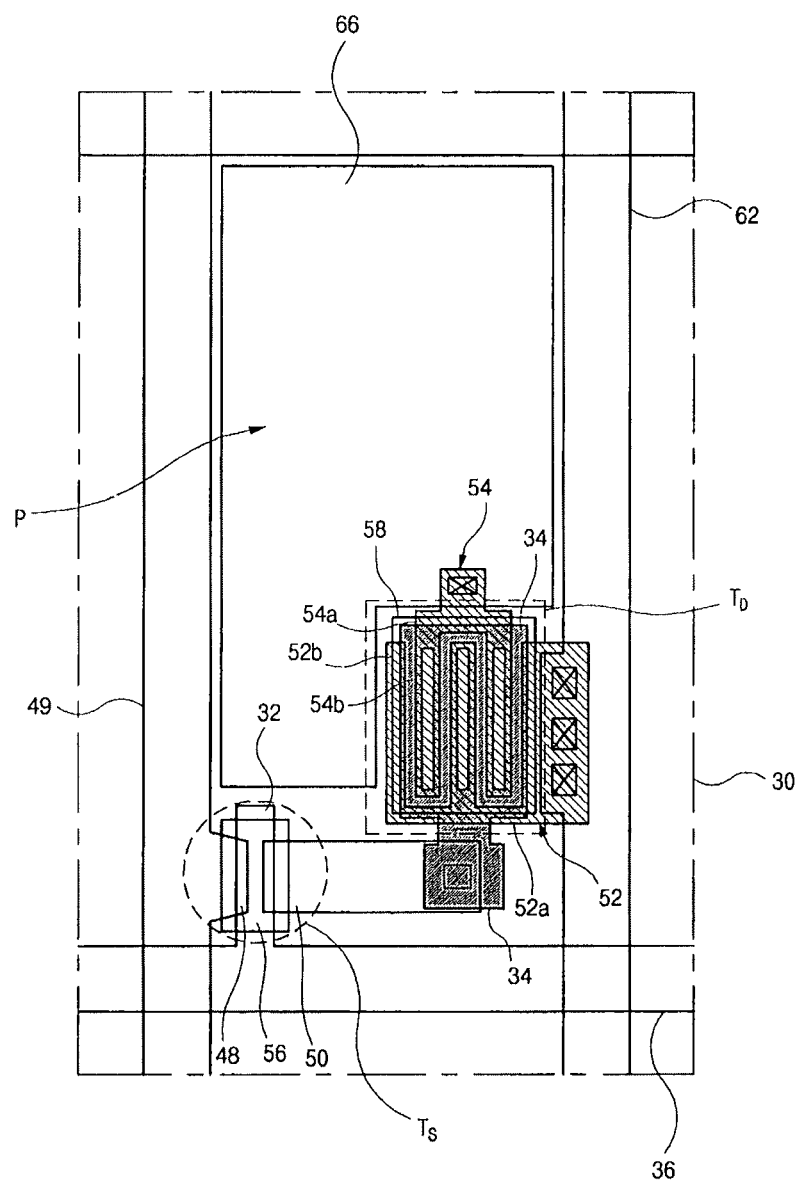
FIG. 3 is a schematic cross-sectional view illustrating a switching element and a driving element including an amorphous TFT for one pixel region of an OLED according to the related art.
Figure 4:
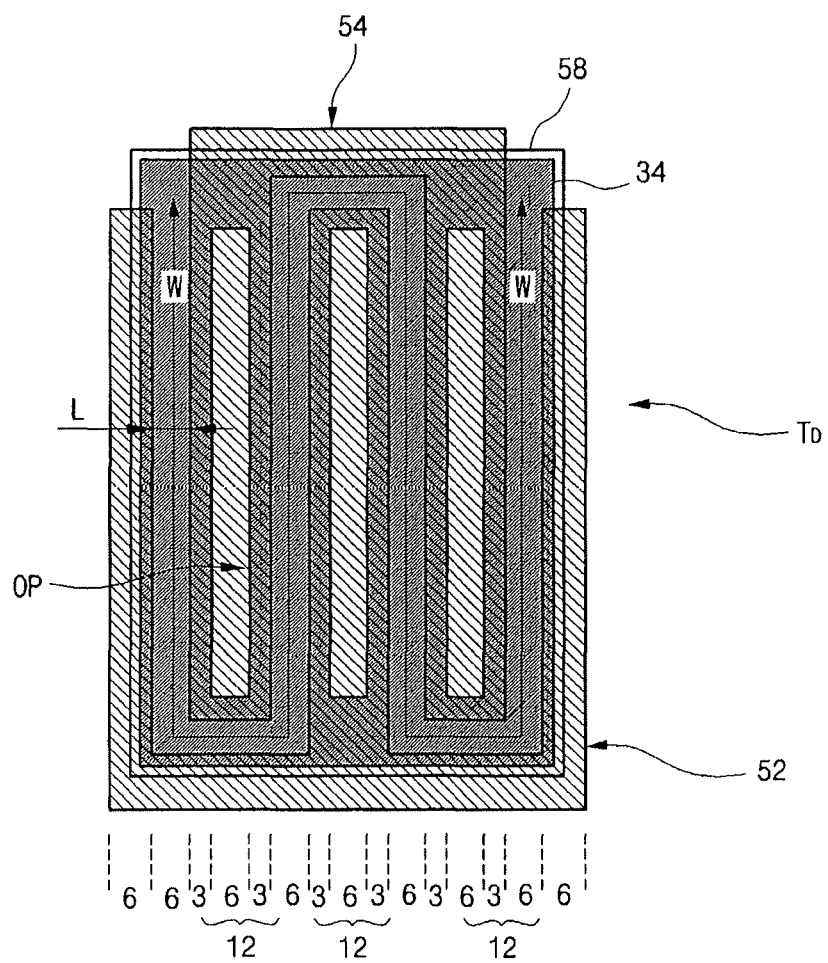
FIG. 4 is a schematic plan view showing a driving element of an OLED according to a first example of the related art.
Figure 5:
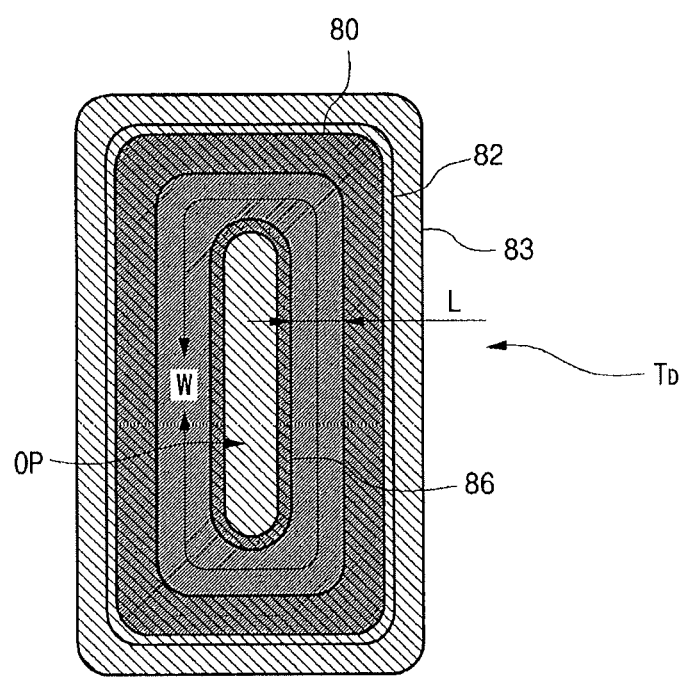
FIG. 5 is a schematic plan view showing a driving element of an OLED according to a second example of the related art.

That is, since a width of the driving gate electrode 106 according to the present invention is reduced in comparison with the width of the driving gate electrode 34 (of FIG. 3) of the related art, an occupied area of the driving element $T_D$ can be reduced with the same width to length ratio (W/L ratio) of the related art. Therefore, when this structure is applied to the driving element $T_D$ for OLED, it can obtain a high resolution.

Here, an overlap portion between the driving gate electrode 106 and the driving source electrode and drain electrode 122 and 123 is utilized for a storage capacitance.

Figure 7:
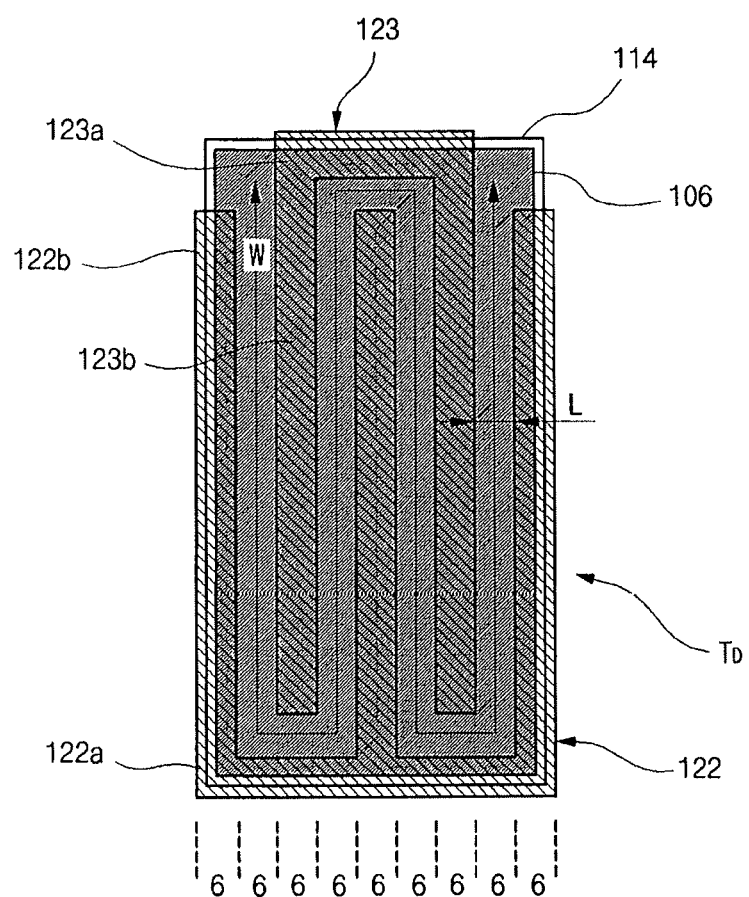
FIGS. 7 to 9 are schematic plan views showing a driving element of an OLED according to first to third exemplary embodiments of the present invention, respectively.
Figure 8:
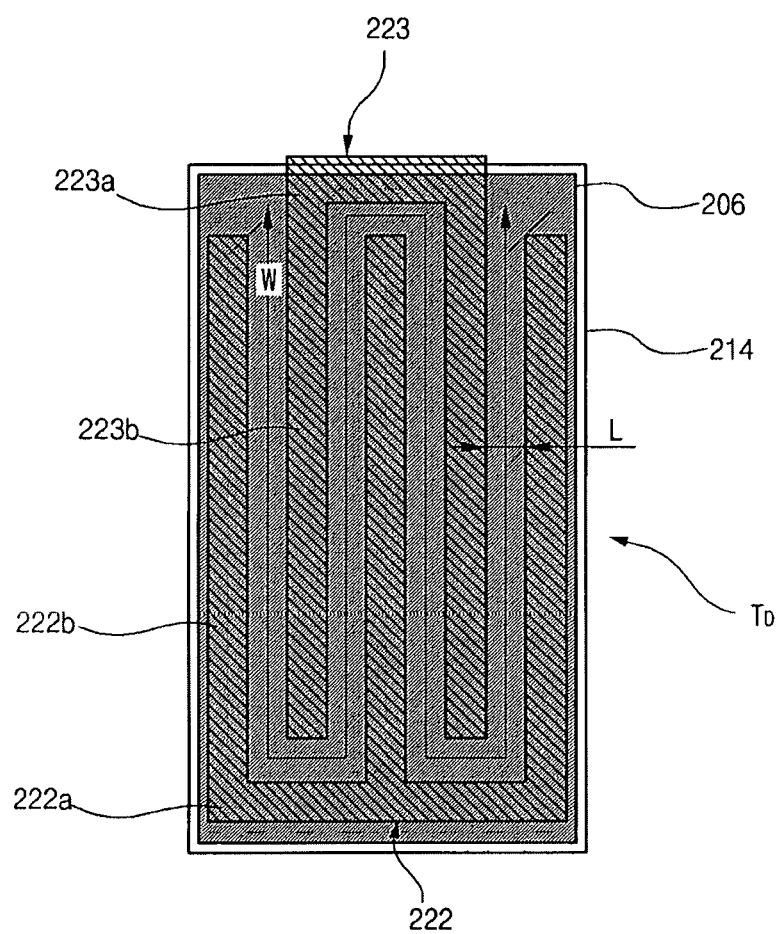
Figure 9:
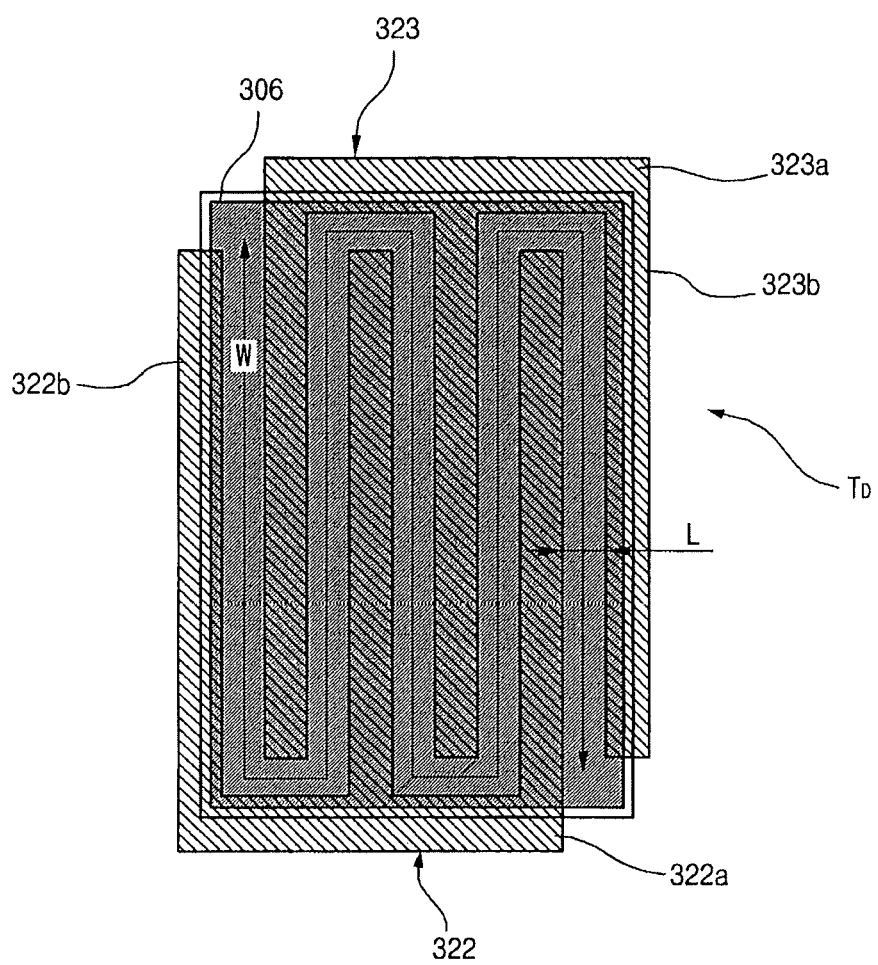

FIGS. 7 to 9 are schematic plan views showing a driving element of an OLED according to first to third exemplary embodiments of the present invention, respectively.

In FIG. 7, a driving element $T_D$ includes a driving gate electrode 106, a driving semiconductor layer 114 over the driving gate electrode 106, a driving source electrode 122 on the driving semiconductor layer 114 and a driving drain electrode 123 spaced apart from the driving source electrode 122 on the driving semiconductor layer 114, wherein the driving gate electrode 106 has an area corresponding to the driving drain electrode 123 and the driving source electrode 122 including an interval therebetween. In other words, the entire surface of the driving source electrode and drain electrode 122 and 123 overlap the driving gate electrode 106. At this time, each of widths of the second driving source electrodes 122b and the second driving drain electrodes 123b is about 6 micrometers as a minimum width and a channel length L defined as a distance between the second driving source electrodes 122b and the second driving drain electrodes 123b is about 6 micrometers.

As the above explained, the width of the driving element $T_D$ according to the first embodiment of the present invention can be calculated as follows:

The width of the second driving source electrode 122b: 6 micrometers×3=18 micrometers The width of the driving drain electrode 123b: 6 micrometers×2=12 micrometers The total channel length L of the driving element $T_D$: 6 micrometers×4=24 micrometers Accordingly, the width of the driving element $T_D$: (18+12+24) micrometers=54 micrometers At this time, the channel length L is the same as the channel length according to the related art. In addition, the length of the driving element $T_D$ is the same as the length thereof according to the related art. Accordingly, while the width of the driving gate electrode 106 is smaller than that of the related art, the distance and the width between the second driving source electrode 122b and the second driving drain electrode 123b can be maintained as that of the related art. Therefore, a high aperture ratio is obtained because the width of the driving element $T_D$ is reduced. Further, the OLED having a high resolution can be manufactured using the driving element according to the present invention since the overall size of the drive element can be reduced without sacrificing performance.

As shown in FIG. 7, outermost second driving source electrodes 122b of the plurality of second driving source electrodes 122b are in a periphery with outermost second driving drain electrodes 123b of the plurality of second driving drain electrodes 123b, wherein each of the outermost driving source electrodes 122b has a first portion overlapping the driving gate electrode 106 and a second portion not overlapping the driving gate electrode 106.

In FIG. 8, the driving source electrode 222 is positioned at an inside of the driving gate electrode 206. Here, since the width of the driving gate electrode 206 is at least about 6 micrometers, a negative effect does not occur.

In FIG. 9, a driving element $T_D$, which provides an improved width to length ratio (W/L ratio) as compared to the first and second embodiments, is suggested as a highly improved characteristic of on current due to the large width to length ratio (W/L ratio).

In particular, one of the outermost second driving source electrodes 322b of the plurality of second driving source electrodes 322b and one of the outermost second driving drain electrodes 323b of the plurality of second driving drain electrodes 323b are positioned at both outsides of the driving element $T_D$, respectively. More specifically, each of the one of the outermost second driving source electrodes 322b and the one of the outermost second driving drain electrodes 323b has a third portion overlapping the driving gate electrode 306 and a fourth portion not overlapping the driving gate electrode 306.

Here, the second driving source electrodes 322b and the second driving drain electrodes 323b are three, respectively, thereby increasing the number of the channels therebetween.

For example, when the width between the second driving source electrode 322b and the second driving drain electrode 323b is about 6 micrometers and the channel length L between the second driving source electrode 322b and the second driving drain electrode 323b is about 6 micrometers, the width of the driving element $T_D$ can be calculated as follows:

The width of the driving source electrode 322b: 6 micrometers×3=18 micrometers

The width of the driving drain electrode 323b: 6 micrometers×3=18 micrometers

The total channel length L of the driving element $T_D$:
6 micrometers×5=30 micrometers Accordingly, the width of the driving element $T_D$:
(18+18+30) micrometers=66 micrometers.

Although this structure according to the third embodiment provide a larger channel width than the structure of the first and second embodiments, the width thereof is smaller than the width of the related art in accordance with increasing the number of the interval between the driving source electrode and drain electrode 322b and 323b. Therefore, a much larger width to length ratio (W/L ratio) can be obtained compared with the related art while still reducing the overall size of the driving element.

Accordingly, as on current of the driving element $T_D$ increases, voltage stress applied to the driving element $T_D$ can be minimized. In addition, since overlapping size between the driving gate electrode 306 and the driving source electrode and drain electrode 322b and 323b is larger than the overlapping size according to the related art, enough storage capacitance can be obtained.

Figure 10:
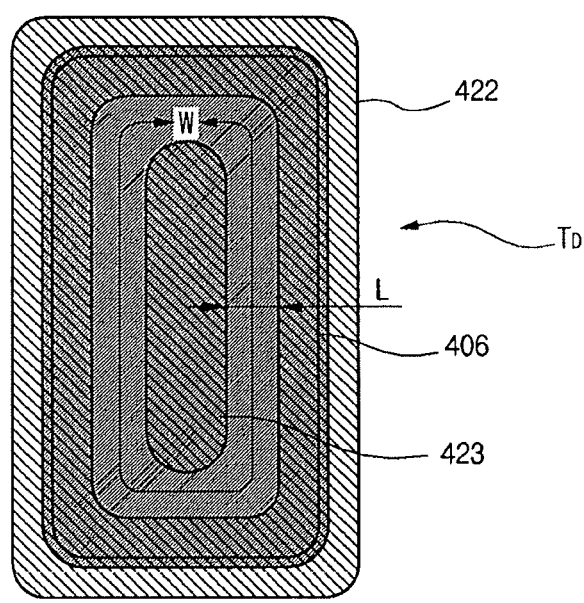
FIG. 10 is a schematic plan view showing a driving element $T_D$ having a ring shape of an OLED according to a fourth exemplary embodiment of the present invention.

FIG. 10 is a schematic plan view showing a driving element $T_D$ having a ring shape of an OLED according to a fourth exemplary embodiment of the present invention.

In FIG. 10, a driving element $T_D$ includes a driving gate electrode 406, a driving source electrode 422 having a ring shape, and a driving drain electrode 423 spaced apart from the driving source electrode 422 and surrounded by the driving source electrode 422, wherein the driving source electrode 422 and the driving drain electrode 423 including an interval therebetween corresponds to the driving gate electrode 406.

Also, this embodiment has an advantage that a much larger storage capacitance can be obtained due to the structure of the driving gate electrode 406.

FIGS. 11A to 11F, 12A to 12F are schematic cross sectional views taken along lines XI-XI and XII-XII in FIG. 6, respectively, illustrating a fabricating process of a driving element of an OLED according to an embodiment of the present invention.

Figure 11A:
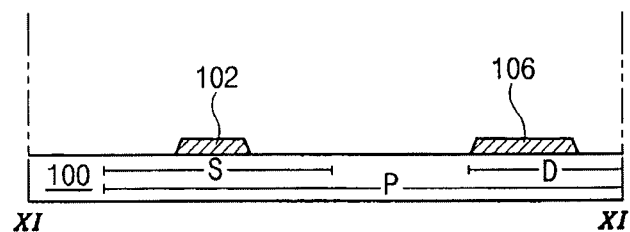
FIGS. 11A to 11F, 12A to 12F are schematic cross sectional views taken along lines XI-XI and XII-XII in FIG. 6, respectively, illustrating a fabricating process of a driving element of an OLED according to an embodiment of the present invention.
Figure 12A:
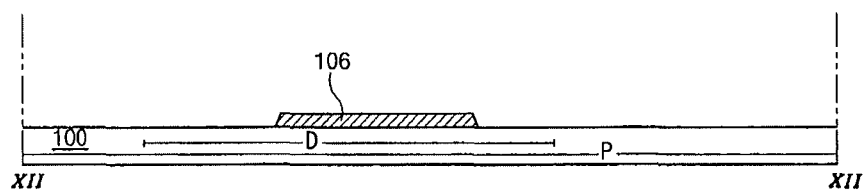

In FIGS. 11A and 12A, a pixel region P, a switching region S and a driving region D are defined in a first substrate 100. A switching gate electrode 102 and a driving gate electrode 106 are formed on the first substrate 100 by depositing and patterning a metal layer such as aluminum (Al), Al alloy, tungsten (W), copper (Cu), molybdenum (Mo), titanium (Ti) or the like. Although not shown, the switching gate electrode 102 is connected to a gate line which is on the first substrate 100 in a first direction.

It is noted that the driving gate electrode 106 is formed to correspond to a driving source electrode and a driving drain electrode that will be formed later.

Figure 11B:
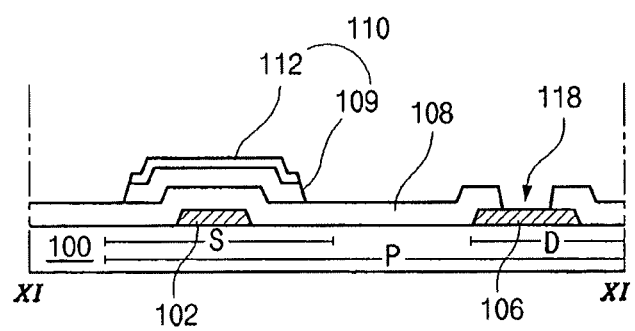
Figure 12B:
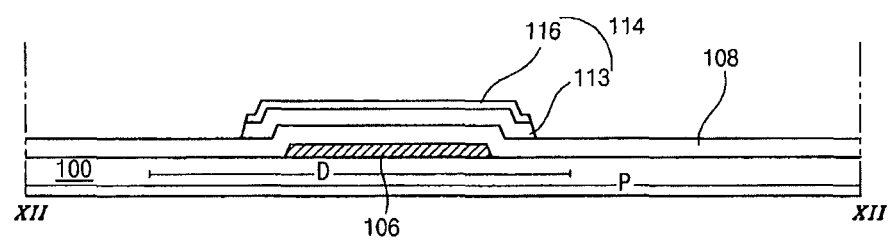

In FIGS. 11B and 12B, a gate-insulating layer 108 is formed over the first substrate 100 having the switching gate electrode 102 and the driving gate electrode 106. The gate-insulating layer 108 is formed by depositing an inorganic insulating material such as silicon nitride ($SiN_x$) or silicon oxide ($SiO_2$). A switching semiconductor layer 110 and a driving semiconductor layer 114 are formed over the switching gate electrode 102 and driving gate electrode 106, respectively, by sequentially depositing and patterning intrinsic amorphous silicon and doped amorphous silicon. Thus, the gate-insulating layer 108 is formed between the switching and driving semiconductor layers 110 and 114 and the switching and driving gate electrodes 102 and 106, respectively. The switching semiconductor layer 110 includes a switching active layer 109 and a switching ohmic contact layer 112. Likewise, the driving semiconductor layer 114 includes a driving active layer 113 and a driving ohmic contact layer 116. In addition, the gate-insulating layer 108 has a gate contact hole 118 that exposes a portion of the driving gate electrode 106 (FIG. 11B).

Figure 11C:
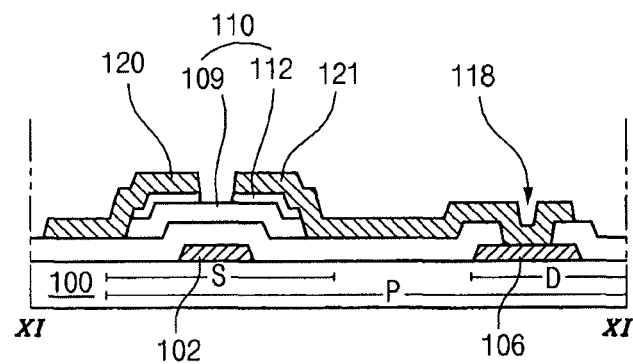
Figure 12C:
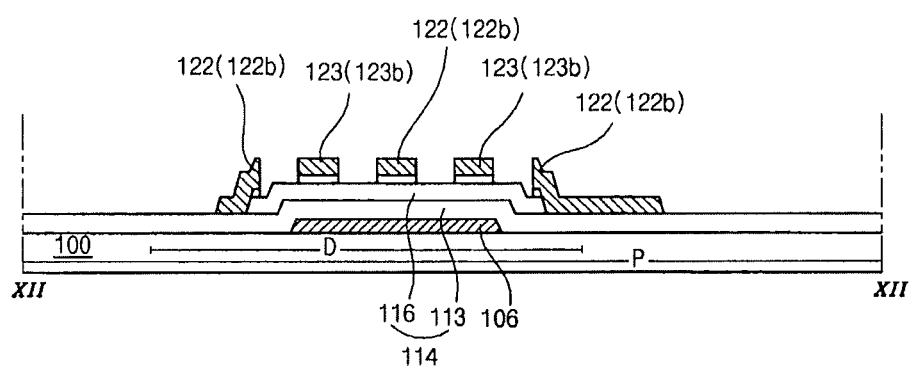

In FIGS. 11C and 12C, switching source electrode and drain electrode 120 and 121, and driving source electrode and drain electrode 122 and 123 are formed on the switching semiconductor layer 110 and driving semiconductor layer 114, respectively, by depositing and patterning a metal layer. Specifically, the switching source electrode and drain electrode 120 and 121 contact the switching ohmic contact layer 112, and the driving source electrode and drain electrode 122 and 123 contact the driving ohmic contact layer 116.

The driving source electrode 122 includes a first driving source electrode 122a along the first direction (not shown in FIG. 12C) and a plurality of second driving source electrodes 122b extending from the first driving source electrode 122a along the second direction crossing the first direction. The driving drain electrode 123 is spaced apart from the driving source electrode 122, the driving drain electrode 123 including a first driving drain electrode 123a along the first direction (not shown in FIG. 12C) and a plurality of second driving drain electrodes 123b extending from the first driving drain electrode 123a along the second direction, wherein the plurality of second driving source electrodes 122b alternate with the plurality of second driving drain electrodes 123b, and the driving source electrode 122 and the driving drain electrode 123 including an interval therebetween corresponds to the driving gate electrode 106. Here, the driving gate electrode 106 is connected to the switching drain electrode 121 through the gate contact hole 118.

Next, a portion of the switching and driving ohmic contact layers 112 and 116, respectively, between the switching and driving source electrodes 120 and 122 and the switching and driving drain electrodes 121 and 123 are removed to expose a portion of the switching and driving active layer 109 and 113 under the portion of switching and driving ohmic contact layers 112 and 116, respectively.

Figure 11D:
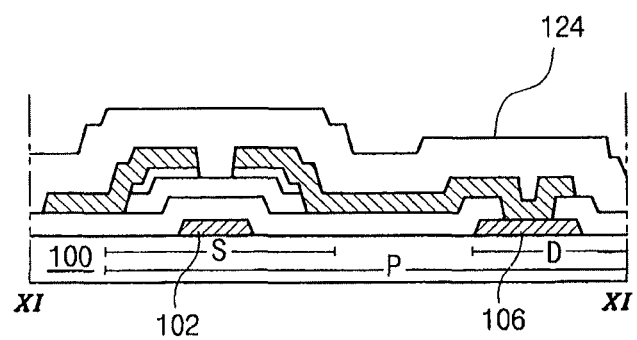
Figure 12D:
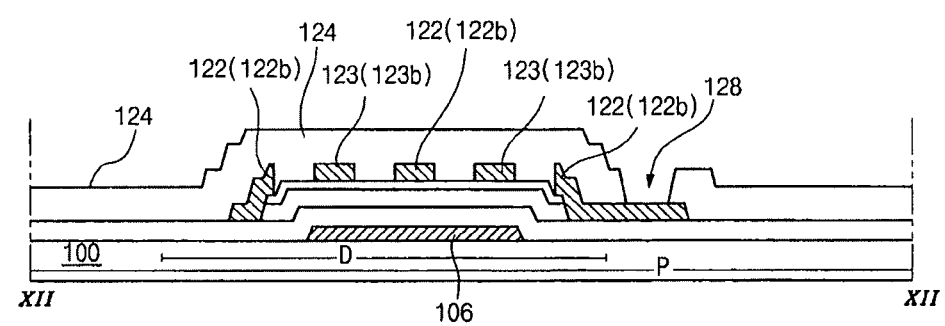

In FIGS. 11D and 12D, a first passivation layer 124 is formed over the first substrate 100 including the switching source electrode and drain electrode 120 and 121, and the driving source electrode and drain electrode 122 and 123. The first passivation layer 124 has a first contact hole 128 that exposes an edge portion of the driving source electrode 122.

Figure 11E:
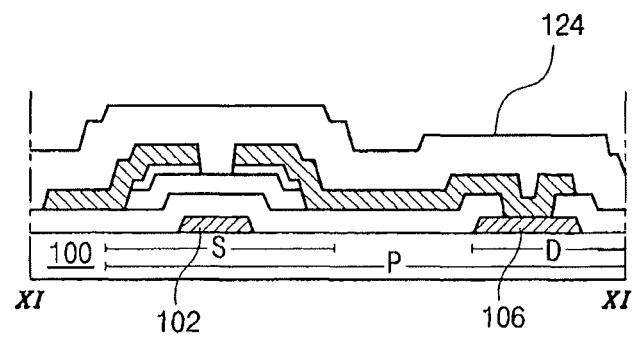
Figure 12E:
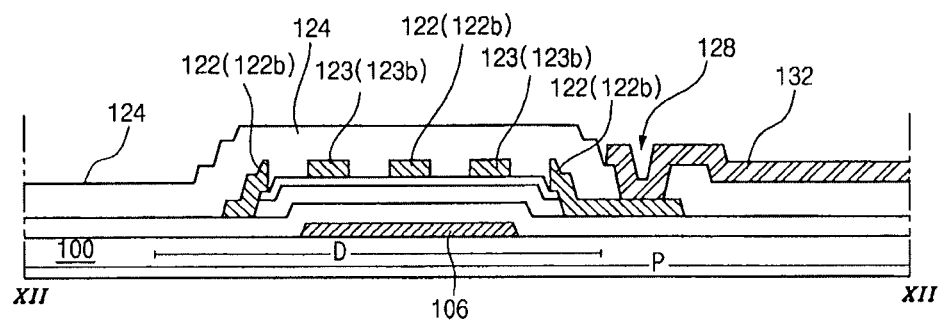

In FIGS. 11E and 12E, a power line 132 (FIG. 12E) is formed by depositing and patterning a conductive layer and is connected to the driving source electrode 122 through the first contact hole 128. However, power line 132 may be formed simultaneously with gate electrode 106.

Figure 11F:
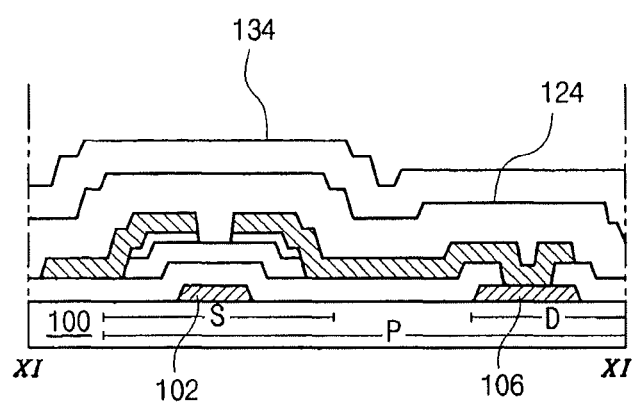
Figure 12F:
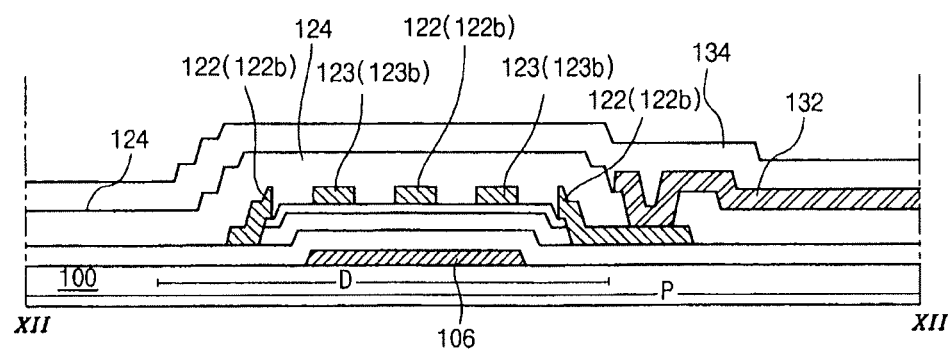

In FIGS. 11F and 12F, a second passivation layer 134 is formed by depositing an inorganic insulating material such as silicon nitride (SiNx) or silicon oxide ($SiO_2$) or by coating an organic insulating material such as benzocylcobutene (BCB) or acrylic resin. Although not shown in FIGS. 11F and 12F, the second passivation layer 134 may have a second contact hole through which the driving drain electrode 123 is connected to the first electrode 166 (of FIG. 6).

Although not shown, an organic electroluminescent diode is connected to the driving element $T_D$. More specifically, the organic electroluminescent diode includes a first electrode connected to the driving drain electrode 123, an organic electroluminescent layer on the first electrode and a second electrode on the organic electroluminescent layer.

When the first electrode functions as a cathode, it includes a transparent conductive material having a high work function. When the second electrode functions as an anode, the second electrode may be made of an opaque (non-transparent) conductive material having a small work function.

Although the minimum width between the driving source electrode and the driving drain electrode is about 6 micrometers according to the embodiments of the present invention, the width is not limited to 6 micrometers. For example, the width therebetween may be more than about 6 micrometers.

When the driving element of the OLED according to the present invention includes the driving gate electrode corresponding to the driving source electrode and the driving drain electrode including the interval therebetween, the width of the driving gate electrode can be reduced without changing the width to length ratio (W/L). Therefore, the OLED using the driving element can achieve as a high resolution.

In addition, when the width of the driving gate electrode is fixed, the number of the second driving source and drain electrodes can be increased to improve the on current characteristics so that stable driving features can be obtained.

Further, the increase in the overlap area between the driving gate electrode and the driving source and drain electrodes can be utilized as storage capacitance. Consequently, additional storage capacitance is no longer required and productivity yield can be improved.

It will be apparent to those skilled in the art that various modifications and variations can be made in the OLED and a method of fabricating the same of the present invention without departing from the spirit or scope of the invention. Thus, it is intended that the present invention cover the modifications and variations of this invention provided they come within the scope of the appended claims and their equivalents.

What is claimed is:

1. An organic electroluminescent device, comprising:
   a gate line on a substrate;
   a data line crossing the gate line to define a pixel region;
   a power line crossing one of the gate line and the data line;
   a switching element;
   a driving element including:
      a driving gate electrode connected to the switching element, the driving gate electrode formed uniformly on the substrate;
      a gate-insulating layer on the driving gate electrode;
      a driving semiconductor layer on the gate-insulating layer;
      a driving source electrode connected to the power line, the driving source electrode having a first driving source electrode along a first direction and a plurality of second driving source electrodes extending from the first driving source electrode along a second direction crossing the first direction;
      a driving drain electrode spaced apart from the driving source electrode, the driving drain electrode having a first driving drain electrode along the first direction and a plurality of second driving drain electrodes extending from the first driving drain electrode along the second direction, wherein the plurality of second driving source electrodes alternate with the plurality of second driving drain electrodes,
      wherein the driving source electrode and the driving drain electrode including an interval therebetween are facing the driving gate electrode,
      wherein the driving semiconductor layer on the gate-insulating layer completely covers four sides of the driving gate electrode under the gate-insulating layer; and
      an organic electroluminescent diode connected to the driving element,
      wherein one of outermost second driving source electrodes of the plurality of second driving source electrodes and one of outermost second driving drain electrodes of the plurality of second driving drain electrodes are positioned at opposing outermost edges of the driving element, respectively.

2. The device according to claim 1, wherein each of the one of outermost second driving source electrodes and the one of the outermost second driving drain electrodes has a third portion overlapping the driving gate electrode and a fourth portion not overlapping the driving gate electrode.

3. A method of fabricating an organic electroluminescent device, comprising:
   preparing a substrate including a pixel region having a switching region and a driving region;
   forming a gate line, a switching gate electrode in the switching region, and a driving gate electrode in the driving region on the substrate, wherein the driving gate electrode is formed uniformly on the substrate;
   forming a gate-insulating layer on the switching gate electrode and the driving gate electrode;
   forming a switching semiconductor layer on the gate-insulating layer over the switching gate electrode and a driving semiconductor layer on the gate-insulating layer over the driving gate electrode;
   forming a data line crossing the gate line, a switching source electrode connected to the data line, a switching drain electrode spaced apart from the switching source electrode and connected to the driving gate electrode, a driving source electrode having a first driving source electrode along a first direction and a plurality of second driving source electrodes extending from the first driving source electrode along a second direction crossing the first direction, and a driving drain electrode spaced apart from the driving source electrode, the driving drain electrode having a first driving drain electrode along the first direction and a plurality of second driving drain electrodes extending from the first driving drain electrode along the second direction,
   wherein the plurality of second driving source electrodes alternate with the plurality of second driving drain electrodes, and the driving source electrode and the driving drain electrode including an interval therebetween are facing the driving gate electrode, and
   wherein the driving semiconductor layer on the gate-insulating layer completely covers four sides of the driving gate electrode under the gate-insulating layer;
   forming a power line crossing one of the gate line and the data line, the power line connected to the driving source electrode; and
   forming an organic electroluminescent diode connected to the driving element,
      wherein one of outermost second driving source electrodes of the plurality of second driving source electrodes and one of outermost second driving drain electrodes of the plurality of second driving drain electrodes are formed to position at both outsides of the driving element, respectively.

4. The method according to claim 3, wherein each of the one of outermost second driving source electrodes and the one of outermost second driving drain electrodes is formed to have a third portion overlapping the driving gate electrode and a fourth portion not overlapping the driving gate electrode.

* * * * *